US009356628B2

(12) United States Patent
Reinart

(10) Patent No.: US 9,356,628 B2
(45) Date of Patent: May 31, 2016

(54) DYNAMICALLY RECONFIGURING REBUILD AGENTS FOR ERASURE CODE REBUILD

(71) Applicant: Quantum Corporation, San Jose, CA (US)

(72) Inventor: John Reinart, Roseville, MN (US)

(73) Assignee: QUANTUM CORPORATION, San Jose, CA (US)

( * ) Notice: Subject to any disclaimer, the term of this patent is extended or adjusted under 35 U.S.C. 154(b) by 143 days.

(21) Appl. No.: 14/179,647

(22) Filed: Feb. 13, 2014

(65) Prior Publication Data

US 2015/0229338 A1   Aug. 13, 2015

(51) Int. Cl.
*G11C 29/00* (2006.01)
*H03M 13/37* (2006.01)
*G06F 3/00* (2006.01)

(52) U.S. Cl.
CPC ............... *H03M 13/373* (2013.01); *G06F 3/00* (2013.01); *H03M 13/3761* (2013.01)

(58) Field of Classification Search
CPC .... H03M 13/373; H03M 13/3761; G06F 3/00
USPC ................................................. 714/763, 769
See application file for complete search history.

(56) References Cited

U.S. PATENT DOCUMENTS

| | | | | |
|---|---|---|---|---|
| 2006/0123321 A1* | 6/2006 | Deenadhayalan | .. | G06F 11/1088 714/763 |
| 2010/0235677 A1* | 9/2010 | Wylie | ................... | G06F 11/1044 714/5.1 |
| 2011/0208994 A1* | 8/2011 | Chambliss | ........... | G06F 11/1092 714/6.24 |
| 2013/0054891 A1* | 2/2013 | Kawaguchi | ......... | G06F 11/1092 711/114 |
| 2014/0152476 A1* | 6/2014 | Oggier | ................ | H03M 13/373 341/94 |
| 2015/0095747 A1* | 4/2015 | Tamo | ................... | H03M 13/151 714/781 |

* cited by examiner

*Primary Examiner* — David Ton
(74) *Attorney, Agent, or Firm* — Eschweiler & Associates, LLC

(57) ABSTRACT

Example apparatus and methods support reconstructing an item from a set of erasure codes (e.g., fountain codes). Information about computer resources available to support reconstructing the item may be accessed and analyzed to control the spawning of multiple computer processes to support reconstructing the item. The information may include, for example, utilization and capacity data. The information may be provided by sensor agents that monitor the resources. The multiple computer processes may operate at least partially in parallel. Resources may be identified and computer processes may be spawned until all the resources that can contribute to the reconstruction are used. In one embodiment, computer processes may be spawned until the marginal utility of spawning another process falls below a threshold.

19 Claims, 10 Drawing Sheets

DYNAMICALLY RECONFIGURING REBUILD AGENTS FOR ERASURE CODE REBUILD

BACKGROUND

Electronic data is stored in different types of systems. For example, files may be stored by file systems and objects may be stored by object storage systems. Different approaches may be used to protect files, objects and other computerized or electronic information. One approach includes storing redundant copies of a file, object, or other information. To insure data protection, different approaches for storing redundant copies of a file, portions of a file, an object, or other information have been employed. Erasure codes are one such approach.

An erasure code is a forward error correction (FEC) code for the binary erasure channel. The FEC facilitates transforming a message of k symbols into a longer message with n symbols such that the original message can be recovered from a subset of the n symbols, k and n being integers. The original message may be, for example, a file. The fraction $r=k/n$ is called the code rate, and the fraction $k'/k$, where k' denotes the number of symbols required for recovery, is called the reception efficiency. Optimal erasure codes have the property that any k out of the n code word symbols suffice to recover the original message. Optimal codes may require extensive memory usage, CPU time, or other resources when n is large. Parallel processing may be employed when n is large.

Erasure codes are described in coding theory. Coding theory is the study of the properties of codes and their fitness for a certain purpose (e.g., backing up files). Codes may be used for applications including, for example, data compression, cryptography, error-correction, and network coding. Coding theory involves data compression, which may also be referred to as source coding, and error correction, which may also be referred to as channel coding. Fountain codes are one type of erasure code.

Fountain codes have the property that a potentially limitless sequence of encoding symbols may be generated from a given set of source symbols in a manner that supports ideally recovering the original source symbols from any subset of the encoding symbols of size equal to or larger than the number of source symbols. Recovering the original source symbols may require acquiring fountain codes from where they are stored. When a large number of fountain codes need to be recovered, parallel processing may be employed. A fountain code may be optimal if the original k source symbols can be recovered from any k encoding symbols, k being an integer. Fountain codes may have efficient encoding and decoding algorithms that support recovering the original k source symbols from any k' of the encoding symbols with high probability, where k' is just slightly larger than k. A rateless code is distinguished from a code that exhibits a fixed code rate.

Object based storage systems may employ rateless erasure code technology (e.g., fountain codes) to provide a flexible level of data redundancy. The appropriate or even optimal level of data redundancy produced using a rateless erasure code system may depend, for example, on the value of the data. The actual level of redundancy achieved using a rateless erasure code system may depend, for example, on the difference between the number of readable redundancy blocks (e.g., erasure codes) written by the system and the number of redundancy blocks needed to reconstruct the original data. For example, if twenty redundancy blocks are written and only eleven redundancy blocks are needed to reconstruct the original data that was protected by writing the redundancy blocks, then the original data may be reconstructed even if nine of the redundancy blocks are damaged or otherwise unavailable.

When a component in a data storage system stops providing the desired storage (e.g., a hard disk drive (HDD) fails), then an object storage system based on erasure codes may be tasked with providing erasure codes from which items that had been stored on the failed drive can be rebuilt. When a component (e.g., HDD) in a storage system fails, a file(s) stored by the storage system may become unavailable. When erasure codes were generated for the file(s) and stored in an object store, it may be possible to rebuild the file(s). Ideally, the file(s) would be rebuilt as fast as possible to minimize disruptions due to the component failure. Rebuilding a file may involve collecting a number of erasure codes from an object store. An object store may have a number of servers and a number of storage devices (e.g., HDD, SSD). When a component like an HDD fails, it is likely that a large number of files may become unavailable and thus a large number of erasure codes may need to be acquired to rebuild the large number of files. Thus, once again, parallel processing may be performed.

A rebuild agent may be tasked with rebuilding unavailable files. The rebuild agent may need to acquire X out of Y erasure codes to recreate a file, X and Y being integers. If a file was broken into sub-blocks and erasure codes were generated for the sub-blocks, then the rebuild agent may need to acquire X out of Y erasure codes to recreate each sub-block for the file. Thus, if 10,000 files became unavailable, and if the files were sub-divided into 100 sub-blocks on average, then 1,000,000 sub-blocks may need to be rebuilt. If each sub-block was protected by a 20/11 policy, then 20,000,000 erasure codes may have been generated and at least 9,000,000 of those erasure codes may need to be acquired to rebuild the files. Clearly, parallel processing may mitigate time issues associated with acquiring at least 9,000,000 erasure codes and then regenerating messages from the at least 9,000,000 erasure codes.

Conventional object based storage systems based on rateless erasure codes (e.g., fountain codes) may have used a static parallel rebuild in an attempt to reduce the amount of time required to perform a rebuild. Unfortunately, the number of rebuild agents employed in conventional approaches may have been fixed. Additionally, the resources allocated for the fixed number of rebuild agents may also have been fixed. Thus, the value of parallel processing in conventional rebuilds may have been unnecessarily limited.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
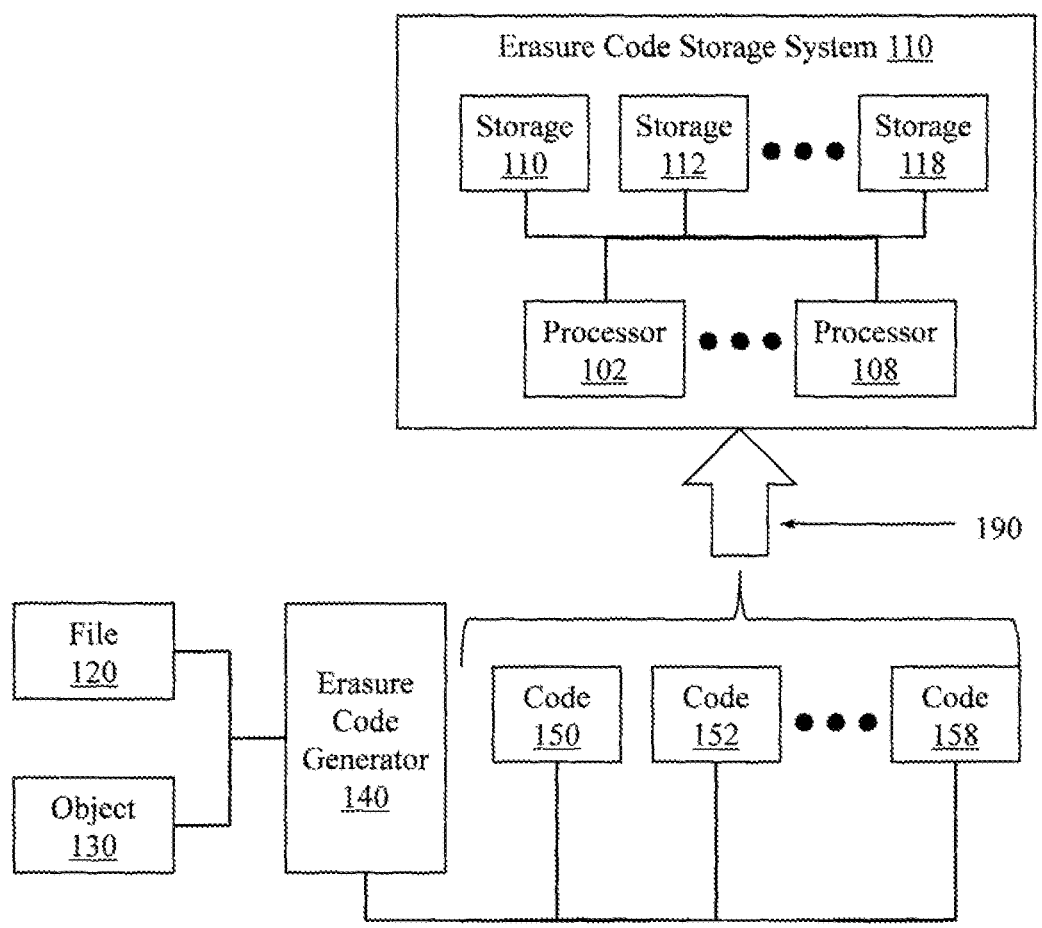
FIG. 1 illustrates an example erasure code storage system.

Example apparatus and methods dynamically reconfigure a rebuild approach in erasure code based rebuilds based on real-time information about resources that are available to participate in a rebuild. In one embodiment, when a rebuild needs to be performed, sensor agents can be queried for data concerning resource availability (e.g., capacity, utilization). Candidate tuples may then be created for resources that could participate in a rebuild operation. Candidate tuples may continue to be produced and rebuild agents may continue to be spawned as long as there are candidate tuples that another rebuild agent could utilize to improve the rebuild process.

Parallel processing can reduce the time it takes to rebuild files, objects, or other data that has become unavailable. Understanding which computing resources are available, the capacity at which a computing resource can operate, and the current utilization for a computing resource may facilitate more intelligently determining how many parallel processes to spawn for a rebuild task. Additionally, understanding resource availability and utilization may facilitate more intelligently allocating available resources to a rebuild process than is possible in a fixed approach.

Computing resources may be monitored by, for example, a sensor agent (SA). A sensor agent may report on the maximum capacity for a resource and the current utilization for a resource. In one embodiment, a sensor agent may be present for each resource. In another embodiment, sensor agents may acquire and report on information for groups of resources. In another embodiment, a server may have a single SA that reports on all the server resources. Resources that can be monitored may include but are not limited to a central processing unit (CPU), a hard disk drive (HDD), a solid state device (SSD), a tape drive (TD), a network attached storage (NAS), a network interface card (MC), a network interface (NI), and a network link. A sensor agent may provide different information for different resources. For example, for a CPU, where the maximum performance is fixed (e.g., N instructions per second), a sensor agent may report on the utilization of the CPU without reporting on the pre-determined maximum capacity. For another resource (e.g., network bandwidth), a sensor agent may report on both the potential capacity of the network link and the current utilization of the network link.

Example apparatus and methods may then dynamically reconfigure a rebuild process by allocating a number of rebuild agents based, at least in part, on the information provided by sensor agents about available resources. Example apparatus and methods may then further reconfigure the rebuild process by dynamically allocating computing resources to the rebuild agents based, at least in part, on the information provided by the sensor agents. Thus, unlike conventional systems that apply a fixed set of processes or resources to a rebuild, example apparatus and methods may dynamically determine the number of processes to apply to a rebuild and may intelligently allocate resources to those processes.

FIG. 1 illustrates an example erasure code storage system 110. A file 120 or an object 130 may be presented to an erasure code generator 140. The erasure code generator 140 may produce erasure codes (e.g., erasure code 150, and erasure codes 152 through 158). The erasure codes may be presented to the erasure code storage system 110 across a communication system 190. Communication system 190 may include, for example, a network interface, a network interface card (MC), a network channel, or other communication resources. The erasure codes may then be processed and stored by erasure code storage system 110.

Erasure code storage system 110 may include one or more processors (e.g., processor 102 through processor 108) and may also include one or more storage devices (e.g., storage 110, and storages 112 through 118). The storage devices may include, for example, a hard disk drive (HDD), a solid state device (SSD), a tape drive, or other storage apparatus. The erasure codes may be distributed by the processors to the data stores using different patterns or algorithms.

Figure 2:
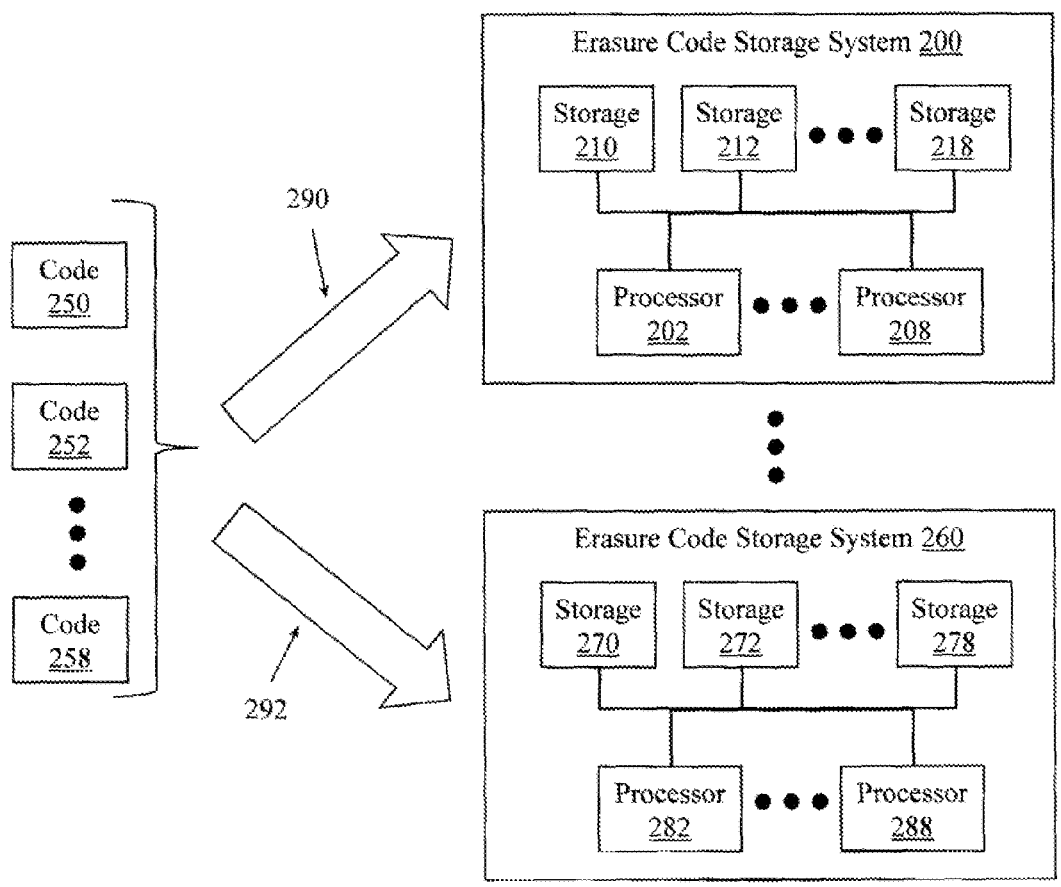
FIG. 2 illustrates an example erasure code storage system.

FIG. 2 illustrates an example erasure code storage system 200 and an example erasure code storage system 260. While FIG. 1 illustrated a single erasure code storage system 110 storing erasure codes, FIG. 2 illustrates a plurality of erasure code storage systems co-operating to store erasure codes (e.g., code 250, and codes 252 through 258). Since there are multiple erasure code storage systems, the erasure codes may travel over multiple communication systems (e.g., communication system 290, communication system 292). While two communication systems are illustrated, a greater or lesser number of communication systems may be employed to provide codes to a greater or lesser number of erasure code storage systems.

Erasure code storage system 200 includes processors (e.g., processor 202 through processor 208) and storage (e.g., storage 210 and storages 212 through 218). Similarly erasure code storage system 260 includes processors (e.g., processor 282 through processor 288) and storage (e.g., storage 270 and storages 272 through 278). The erasure codes may be distributed between the available erasure code storage systems, and may also be distributed within the available erasure code storage systems. Thus, a large number of computer resources may be involved in storing the erasure codes. For example, communication resources may be involved in providing the erasure codes to erasure code storage systems, processors may be involved in analyzing and distributing the erasure codes, and storage may be involved in storing the erasure codes. These resources may also be employed to rebuild an item.

Figure 3:
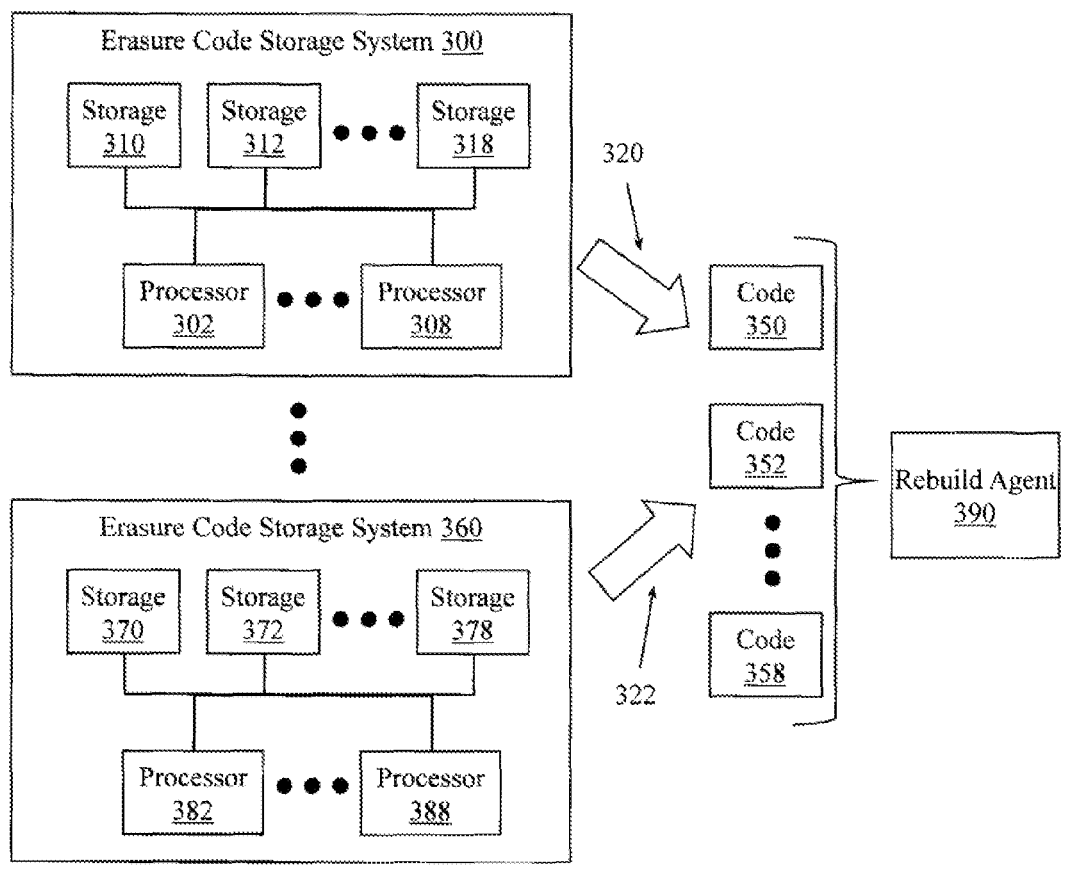
FIG. 3 illustrates an example rebuild agent.

FIG. 3 illustrates an example rebuild agent 390. Rebuild agent 390 may collect erasure codes (e.g., code 350, and codes 352 through 358) to rebuild an item. The erasure codes may be collected from erasure code storage systems including erasure code storage system 300 through erasure code storage system 360. The erasure codes may be provided to the rebuild agent 390 through communication systems including communication system 320 and communication system 322. Erasure code storage system 300 may include processors (e.g., processor 302 through processor 308) and storage (e.g., storage 310 and storages 312 through 318). Similarly, erasure code storage system 360 may include processors (e.g., processor 382 through processor 388) and storage (e.g., storage 370 and storages 317 through 378). The time that it may take rebuild agent 390 to rebuild an item from erasure codes may depend, for example, on the capacity and utilization of the various computer resources involved in acquiring the erasure codes. For example, the capacity of the processors and their current utilization, the read time for any particular storage as influenced by the utilization of the storage, or the network latency on a communication link as influenced by the capacity and utilization of the link, may affect how long it takes the rebuild agent 390 to acquire sufficient erasure codes to rebuild an item. Conventional systems may employ a fixed approach where a fixed number of rebuild agents (e.g., computer processes) are spawned to recreate an item. The fixed number of rebuild agents may use pre-defined sets of resources to recreate the item. Example apparatus and methods improve on conventional fixed approaches.

Figure 4:
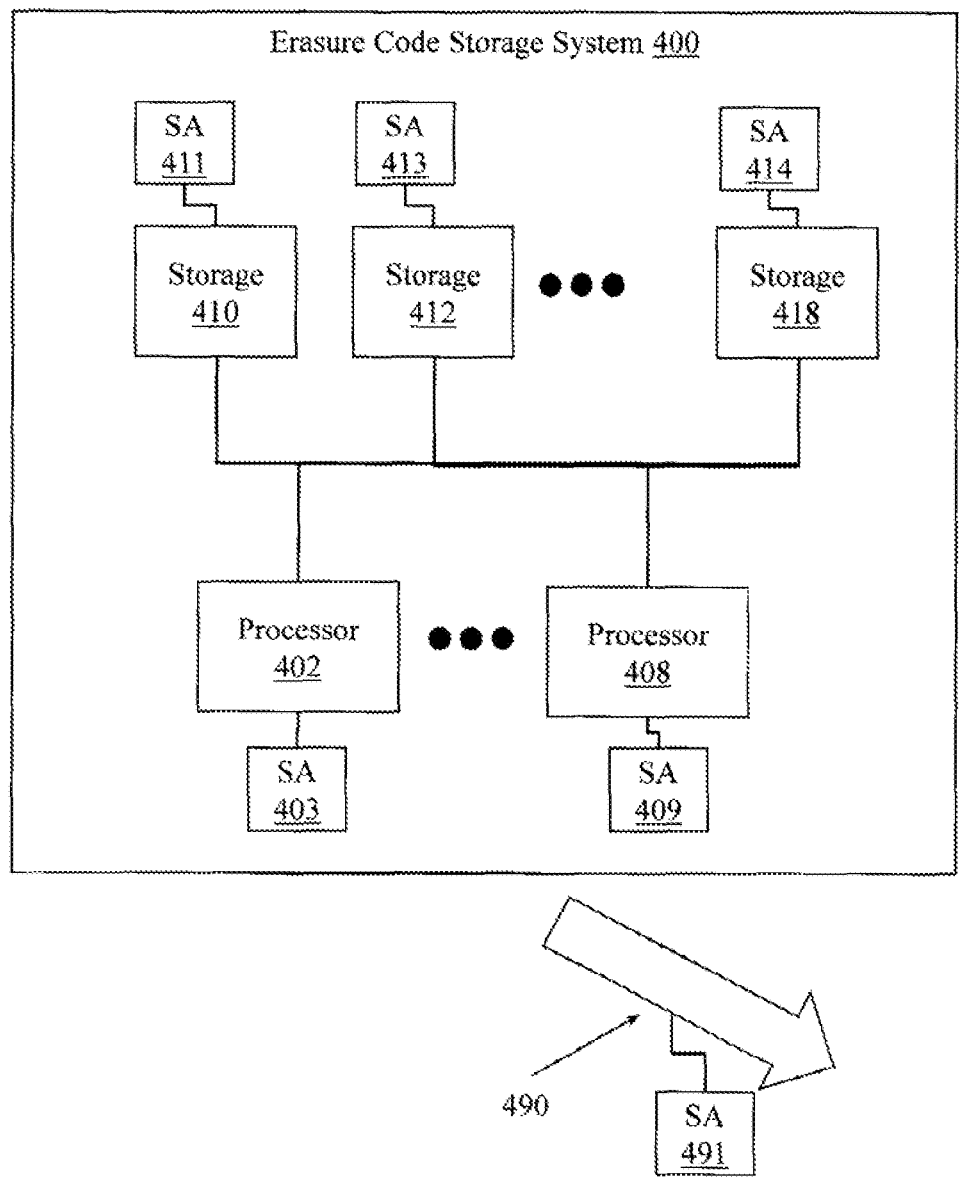
FIG. 4 illustrates an example erasure code storage system with sensor agents.

FIG. 4 illustrates an example erasure code storage system 400 configured with sensor agents. The sensor agents may provide information about, for example, the capacity and utilization of a resource that may participate in reconstructing an item using erasure codes. Erasure code storage system 400 may include a processor 402 that has a related sensor agent 403. In one embodiment, the sensor agent 403 may push information about processor 402 to example systems or methods. In another embodiment, the sensor agent 403 may be queried by example systems or methods to provide information about processor 402. Other components of erasure code storage system 400 may also have associated sensor agents. For example, storage 410 may have sensor agent 411, storage 412 may have sensor agent 413, storage 418 may have sensor agent 414, and processor 408 may have sensor agent 409. A sensor agent may be, for example, a process, thread, circuit, or other apparatus that provides information about a resource that may participate in an erasure code rebuild. Sensor agents may reside inside erasure code storage system 400 or may also reside outside system 400. For example, communication system 490 may also have a sensor agent 491.

In one embodiment, each resource that may participate in an erasure code rebuild may have an associated sensor agent. In other embodiments, sensor agents may be associated with two or more resources or may be associated with a class of resources (e.g., processors in a system, storage in a system). In one embodiment, a system like erasure code storage system 400 may have one sensor agent that provides information about all the resources in the system 400. The sensor agent(s) provide information that can be used to dynamically configure an erasure code rebuild. For example, the number of computer processes that are spawned to support recreating an item(s) may be determined from information provided by the sensor agents. Additionally, the resources to be controlled or accessed by a computer process that is spawned to support recreating an item(s) may be determined from information provided by the sensor agents.

Figure 5:
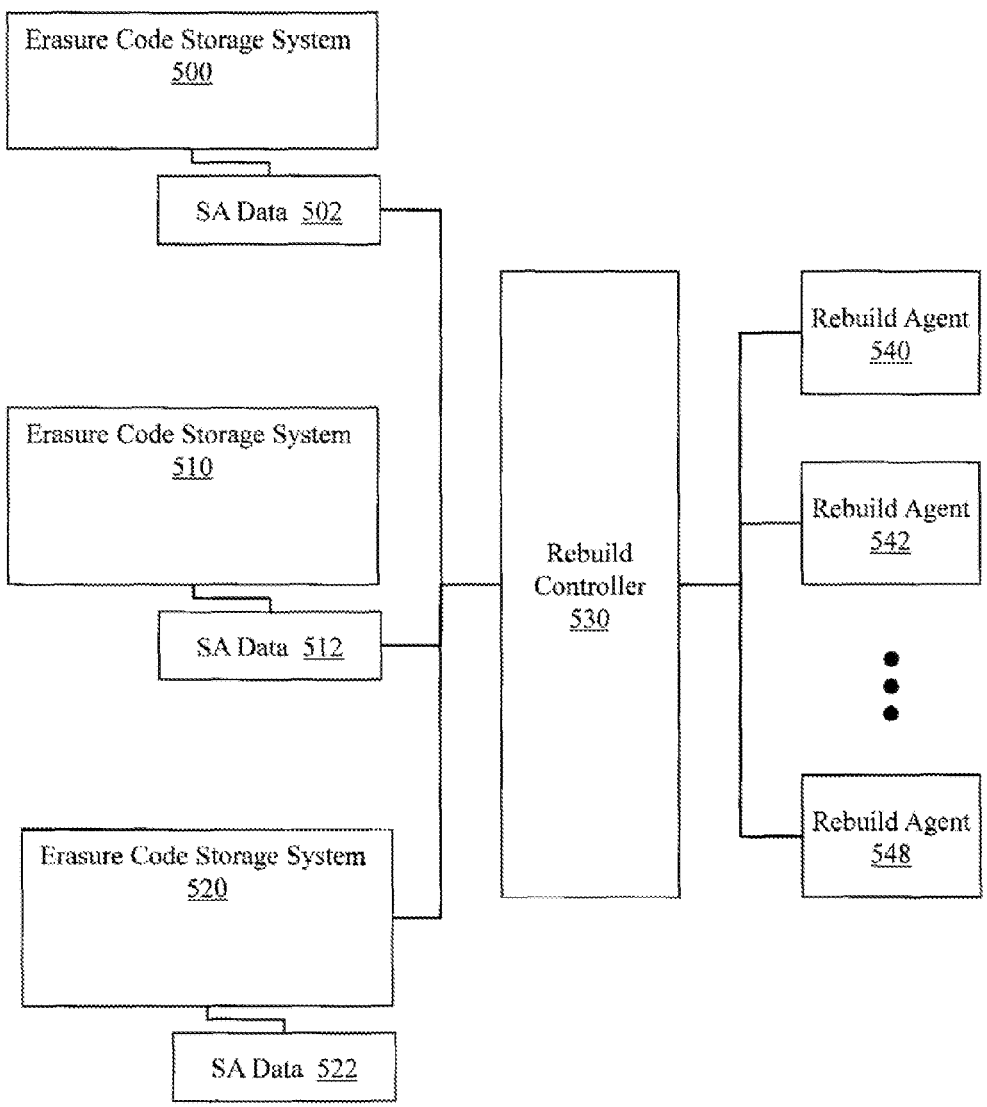
FIG. 5 illustrates an example rebuild controller.

FIG. 5 illustrates an example rebuild controller 530. Unlike conventional systems that produce a fixed number of rebuild agents, rebuild controller 530 acquires information from sensor agents and spawns rebuild agents based on the information acquired from the sensor agents. Rebuild controller 530 may acquire sensor agent data 502 from erasure code storage system 500, may acquire sensor agent data 512 from erasure code storage system 510, and may acquire sensor agent data 522 from erasure code storage system 520. While three erasure code storage systems are illustrated, rebuild controller 530 may acquire sensor agent data from a greater or lesser number of erasure code storage systems. Rebuild controller 530 may then spawn rebuild agents (e.g., rebuild agent 540, and rebuild agents 542 through 548) based on the information in the sensor data. In one embodiment, rebuild controller 530 may continue to spawn rebuild agents as long as there is a resource in an erasure code storage system that could potentially contribute to the rebuild process. Contributing to the rebuild process may include, for example, acquiring an erasure code, processing an erasure code, communicating an erasure code, or other action. A rebuild agent may be, for example, a process running on a computer. In one embodiment, rebuild controller 530 may rank resources according to the value of the contribution a particular resource may make towards the rebuild. For example, a first resource may be predicted to reduce rebuild time by one percent while a second resource may be predicted to reduce rebuild time by five percent. Thus, rebuild controller 530 may spawn a process for the second resource before spawning a process for the first resource. In one embodiment, rebuild controller 530 may spawn processes as long as the predicted utility gained by spawning the process exceeds a threshold. In one embodiment, rebuild controller 530 may consider the resources being used by other processes before deciding to spawn an additional process that would use the same type of resource. For example, if twenty processes using twenty different processors have already been spawned, but only a single process using a single communication interface has been spawned, rebuild controller 530 may not spawn another process to use another processor because the bottleneck in a rebuild process is not the result of processing power available, but rather is the result of communications.

Some portions of the detailed descriptions herein are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated. The physical manipulations create a concrete, tangible, useful, real-world result.

It has proven convenient at times, principally for reasons of common usage, to refer to these signals as bits, values, elements, symbols, characters, terms, or numbers. It should be borne in mind, however, that these and similar terms are to be associated with the appropriate physical quantities and are merely convenient labels applied to these quantities. Unless specifically stated otherwise, it is to be appreciated that throughout the description, terms including processing, computing, and determining refer to actions and processes of a computer system, logic, processor, or similar electronic device that manipulates and transforms data represented as physical (electronic) quantities.

Example methods may be better appreciated with reference to flow diagrams. For purposes of simplicity of explanation, the illustrated methodologies are shown and described as a series of blocks. However, it is to be appreciated that the methodologies are not limited by the order of the blocks, as some blocks can occur in different orders or concurrently with other blocks from that shown and described. Moreover, less than all the illustrated blocks may be required to implement an example methodology. Blocks may be combined or separated into multiple components. Furthermore, additional or alternative methodologies can employ additional, not illustrated blocks.

Figure 6:
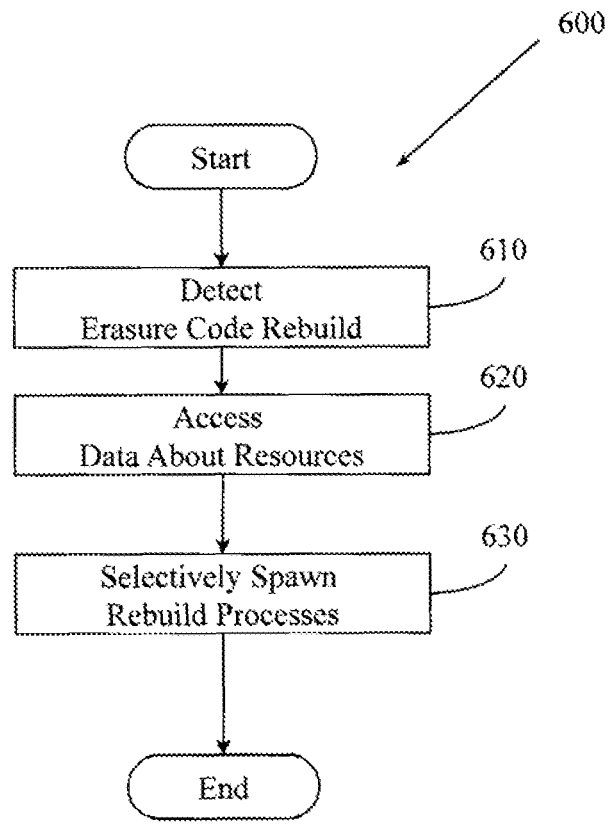
FIG. 6 illustrates an example method associated with dynamically reconfiguring rebuild agents used to support an erasure code based rebuild of an item for which erasure codes were stored.

FIG. 6 illustrates a method 600. Method 600 is associated with dynamically reconfiguring rebuild agents used to support an erasure code based rebuild of an item. Method 600 may include, at 610, detecting an erasure code rebuild of an item for which erasure codes are stored electronically. In one embodiment, detecting an erasure code rebuild of an item comprises receiving a request to support an erasure code rebuild. The request may come, for example, from a file system, from an object system, from an operating system, from a user, or from another location. In another embodiment, detecting an erasure code rebuild of an item may include receiving a request to perform an erasure code rebuild. The request may come, for example, from a Me system, from an object system, from an erasure code system, or from another location. In one embodiment, detecting the need for an erasure code rebuild of an item may include detecting a spawn of a rebuild process.

Method 600 may also include, at 620, accessing electronic data about a set of resources that could participate in the erasure code rebuild. In one embodiment, accessing electronic data about the set of resources includes receiving data pushed from a sensor agent associated with a resource or querying a sensor agent associated with a resource. The sensor agent may be, for example, a process, a thread, a circuit, or other apparatus that acquires and provides information about, for example, the capacity or utilization of a resource. Method 600 may interact with different types and numbers of sensor agents. For example, one sensor agent may have a one-to-one mutually exclusive relationship with a corresponding resource while another sensor agent may have a one-to-many non-mutually exclusive relationship with two or more resources. Information may be acquired from different numbers and types of sensor agents.

The sensor agents may be associated with different types of resources. For example, the resource may be a processor resource, a storage resource, an input/output resource, or a communication resource. The storage resource may be, for example, a data store, a hard disk drive, a solid state device, a tape drive, or other apparatus. The input/output resource may be, for example, a hard disk drive input/output processor, a hard disk drive input/output process, a solid state device input/output processor, a solid state device input/output process, a tape drive input/output processor, a tape drive input/output process, or other apparatus or process. The communication resource may be, for example, a network interface, a network channel, or other apparatus.

Method 600 may also include, at 630, selectively repetitively spawning a rebuild process as a function of the electronic data. A rebuild process utilizes a member of the set of resources to support the erasure code rebuild of the item. In one embodiment, selectively repetitively spawning a rebuild process as a function of the electronic data includes spawning a rebuild process for any member of the set of resources that can contribute to the erasure code rebuild. Contributing to the erasure code rebuild may include, for example, acquiring an erasure code from storage, processing an erasure code, storing an erasure code, or communicating an erasure code. Other embodiments may be more selective, as described in connection with method 700 (FIG. 7).

Figure 7:
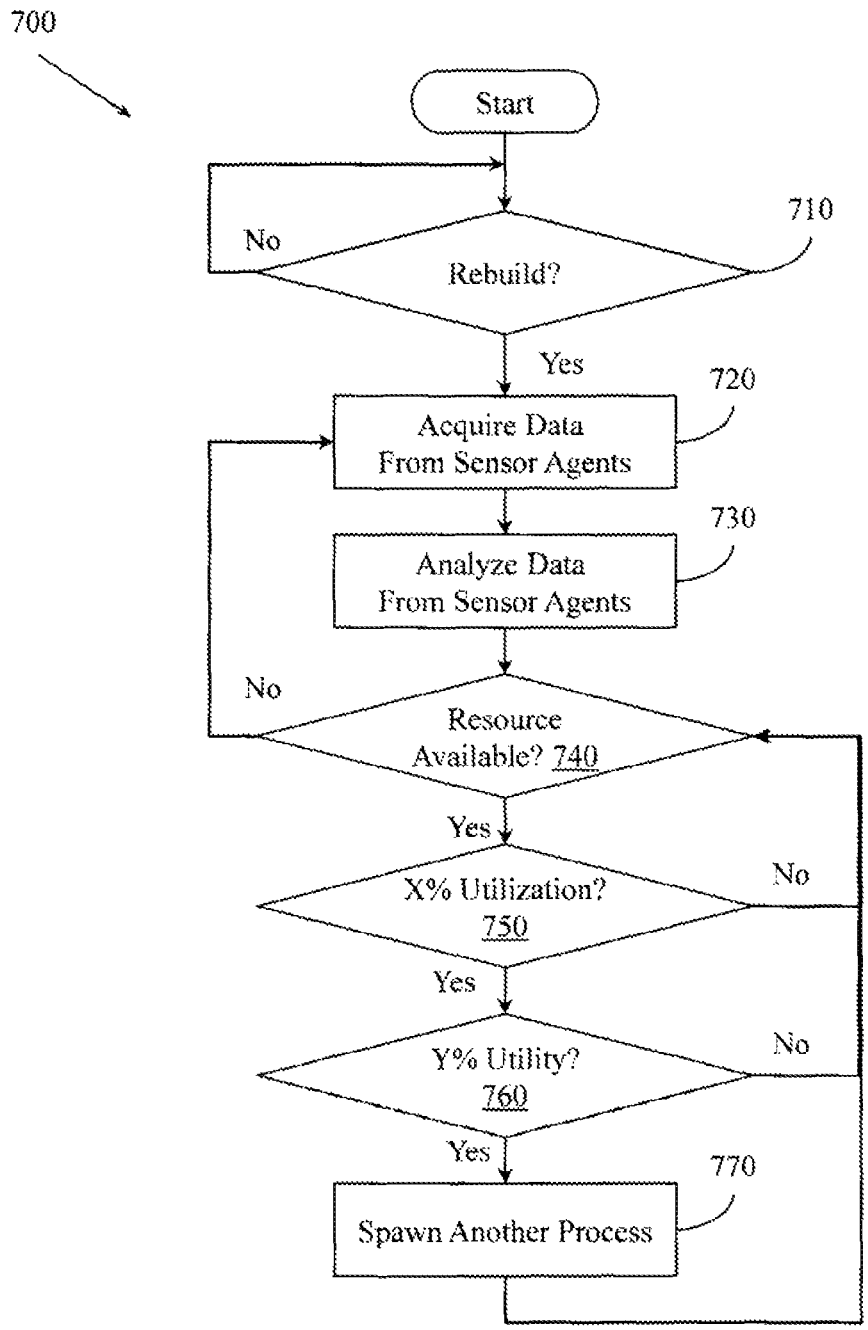
FIG. 7 illustrates an example method associated with dynamically reconfiguring rebuild agents used to support an erasure code based rebuild of an item for which erasure codes were stored.

FIG. 7 illustrates a method 700 associated with dynamically reconfiguring rebuild agents used to support an erasure code based rebuild of an item. Method 700 may include, at 710, detecting an erasure code rebuild of an item. If a rebuild is needed, then method 700 may proceed to 720, otherwise method 700 may wait until a rebuild is needed.

Method 700 may include, at 720, acquiring data from sensor agents. The data may be acquired in different ways from different types and numbers of sensor agents.

Method 700 may include, at 730, analyzing the data acquired from the sensor agents. Analyzing the data may include, for example, determining whether the data indicates that a resource is being utilized above or below a utilization threshold. Analyzing the data may also include, for example, ranking various resources according to their current utilization.

Method 700 may proceed, at 740, to determine whether there is any resource available to contribute to a rebuild. If there is no resource currently available, then method 700 may return to 720 to acquire more up-to-date or additional information from sensor agents. If there is a resource available, then method 700 may proceed to 750.

Method 700 may determine, at 750, whether the resource that is available is already being used above a utilization threshold. For example, if a processor is already running at 95% of its capacity, that processor may contribute very little, if anything, to a reconstruction. Indeed, spawning a rebuild agent for a highly utilized processor may actually slow down a reconstruction if the time spent managing or controlling the process associated with the highly utilized processor consumes more time than the time saved by using the processor. If the resource is above a utilization threshold, then method 700 may return to 740 to consider the next available resource. If the resource is below a utilization threshold, then method 700 may proceed to 760 to predict or determine a utility for using the resource.

Method 700 may, at 760, predict or determine the utility that would be produced by spawning an additional process to use an available resource that is being utilized below a threshold. For example, a processor with sufficient capacity may contribute significantly to reconstruction when the current processors in use are being overwhelmed by a communication system with large bandwidth and low latency. However, a processor with sufficient capacity may not contribute at all to reconstruction when the current processors in use are substantially idle due to a communication system bottleneck.

Method 700 may spawn an additional process at 770 after determining that a resource is available, that the resource is being used less than a threshold amount, and that using the resource would improve reconstruction. Thus, rather than use a fixed number of resources, example apparatus and methods may produce as many rebuild agents as possible or as many rebuild agents that are warranted for a reconstruction under dynamically changing conditions. Using a fixed number of processes and resources may cause a reconstruction to proceed more slowly than possible when there are under-utilized relevant resources. Using a fixed number of processes and resources may also waste resources during a reconstruction when some processes are idle due to bottlenecks.

In one embodiment, method 700 may selectively repetitively spawn a rebuild process as a function of the electronic data when the electronic data reveals that a member of the set of resources can contribute to the erasure code rebuild and produce a utility for using the member of the set of resources that exceeds a rebuild relevance threshold. Recall that contributing to the erasure code rebuild may include acquiring an erasure code from storage, processing an erasure code, storing an erasure code, or communicating an erasure code.

In one embodiment, method 700 may produce a ranking for the set of resources based on the electronic data, and then selectively repetitively spawn rebuild processes in order. The order may be determined by the ranking. In one embodiment, selectively repetitively spawning a rebuild process as a function of the electronic data includes identifying one or more other rebuild processes that are already participating in the erasure code rebuild and identifying members of the set of resources associated with the active rebuild processes. After the currently executing processes and the resources upon which they are operating are identified, method 700 may spawn an additional rebuild process if the new process will improve the rebuild in light of the currently executing processes.

In one example, a method may be implemented as computer executable instructions. Thus, in one example, a computer-readable storage medium may store computer executable instructions that if executed by a machine (e.g., processor) cause the machine to perform method 600 or 700. While executable instructions associated with methods 600 and 700 are described as being stored on a computer-readable storage medium, it is to be appreciated that executable instructions associated with other example methods described herein may also be stored on a computer-readable medium.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and other similar terms, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

ASIC: application specific integrated circuit.
CD: compact disk.
CD-RW: CD rewriteable.
DVD: digital versatile disk and/or digital video disk.
HTTP: hypertext transfer protocol.
LAN: local area network.
RAM: random access memory.
DRAM: dynamic RAM.
SRAM: synchronous RAM.
ROM: read only memory.
PROM: programmable ROM.
SSD: solid state drive
SAN: storage area network.
USB: universal serial bus.
WAN: wide area network.

"Computer component", as used herein, refers to a computer-related entity (e.g., hardware, firmware, software in execution, combinations thereof). Computer components may include, for example, a process running on a processor, a processor, an object, an executable, a thread of execution, and a computer. A computer component(s) may reside within a process and/or thread. A computer component may be localized on one computer and/or may be distributed between multiple computers.

"Computer-readable storage medium", as used herein, refers to a non-transitory medium that stores instructions and/or data. A computer-readable medium may take forms, including, but not limited to, non-volatile media, and volatile media. Non-volatile media may include, for example, optical disks, magnetic disks, and other disks. Volatile media may include, for example, semiconductor memories, dynamic memory, and other memories. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Data store", as used herein, refers to a physical and/or logical entity that can store data. A data store may be, for example, a database, a table, a file, a data structure (e.g. a list, a queue, a heap, a tree) a memory, a register, or other repository. In different examples, a data store may reside in one logical and/or physical entity and/or may be distributed between two or more logical and/or physical entities.

"Logic", as used herein, includes but is not limited to hardware, firmware, software in execution on a machine, and/or combinations of each to perform a function(s) or an action(s), and/or to cause a function or action from another logic, method, and/or system. Logic may include, for example, a software controlled microprocessor, a discrete logic (e.g., ASIC), an analog circuit, a digital circuit, a programmed logic device, or a memory device containing instructions. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, or logical communications may be sent or received. An operable connection may include a physical interface, an electrical interface, or a data interface. An operable connection may include differing combinations of interfaces or connections sufficient to allow operable control. For example, two entities can be operably connected to communicate signals to each other directly or through one or more intermediate entities (e.g., processor, operating system, logic, software). Logical or physical communication channels can be used to create an operable connection.

"Signal", as used herein, includes but is not limited to, electrical signals, optical signals, analog signals, digital signals, data, computer instructions, processor instructions, messages, a bit, or a bit stream, that can be received, transmitted and/or detected.

"Software", as used herein, includes but is not limited to, one or more executable instructions that cause a computer, processor, or other electronic device to perform functions, actions and/or behave in a desired manner. "Software" does not refer to stored instructions being claimed as stored instructions per se (e.g., a program listing). The instructions may be embodied in various forms including routines, algorithms, modules, methods, threads, or programs including separate applications or code from dynamically linked libraries.

"User", as used herein, includes but is not limited to one or more persons, software, logics, applications, computers or other devices, or combinations of these.

Figure 8:
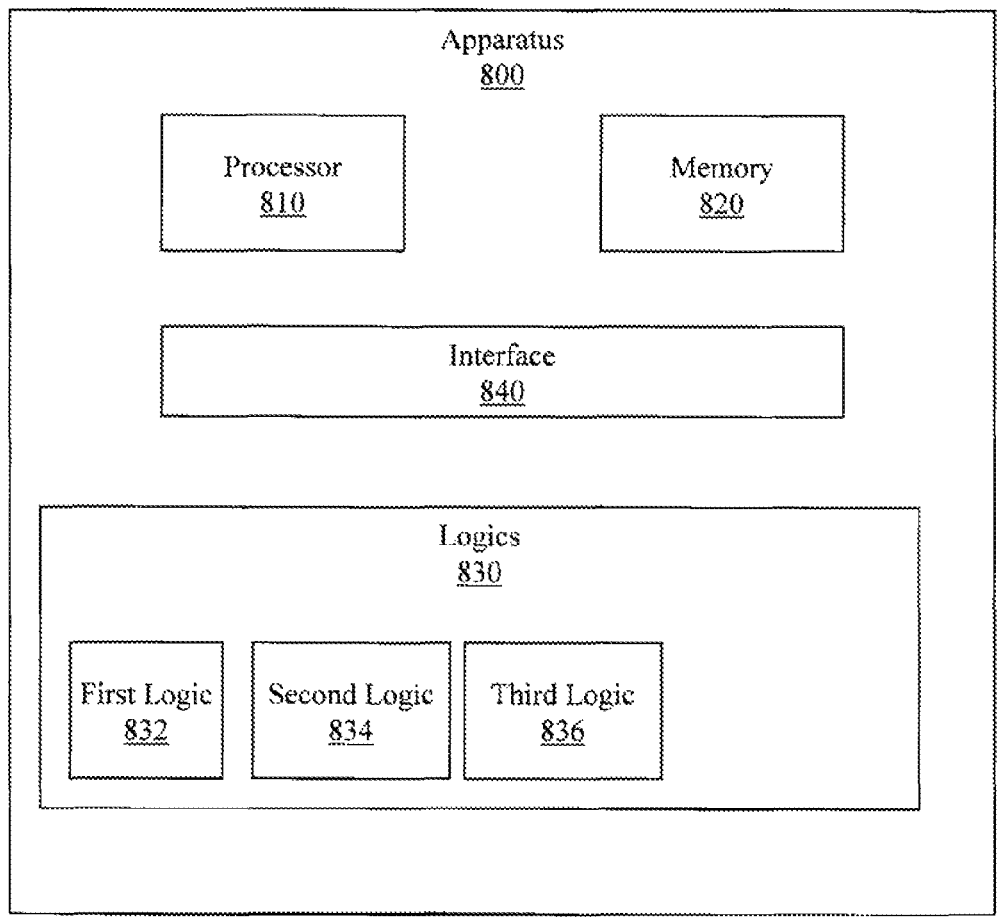
FIG. 8 illustrates an example apparatus configured to dynamically spawn and configure reconstruction processes used to support an erasure code based rebuild of an item for which erasure codes were stored.

FIG. 8 illustrates an apparatus 800 that includes a processor 810, a memory 820, and a set 830 of logics that is connected to the processor 810 and memory 820 by an interface 840. In one embodiment, the apparatus 800 may be an object store system. In one embodiment, the apparatus 800 may be connected to an object store system that includes a set of erasure code storage systems. The set 830 of logics may be configured to support reconstructing an item from a set of fountain codes. Supporting reconstruction of an item from a set of fountain codes may include locating erasure codes, acquiring erasure codes, providing erasure codes to re-assemblers, or other actions.

The set 830 of logics may include a first logic 832 that is configured to acquire information about computer resources available to support reconstructing the item. In one embodiment, the first logic 832 may be configured to pull information about the resources from sensor agents. Pulling the information may include, for example, querying a sensor agent(s). In one embodiment the first logic 832 may be configured to receive information pushed by the sensor agents to the first logic 832. The resources may include, for example, processors, storage, communication systems, or other resources.

The apparatus 800 may also include a second logic 834 that is configured to analyze information about the one or more computer resources with respect to an effect that using the one or more computer resources would have on reconstructing the item. For example, second logic 834 may determine whether using a resource would actually help reduce the amount of time required to reconstruct an item. In one embodiment, the second logic 834 may be configured to determine whether a computer resource will be used to support reconstructing the item. For example, if a resource is already being utilized at a level above a certain threshold, then the resource may not be used. Or, if a large number of similar resources are already being used, then the resource may not be used. In one embodiment, the second logic 834 may be configured to determine the order in which computer resources will be used to support reconstructing the item. For example, if there are ten processors available to support reconstructing an item, then rebuild agents (e.g., processes) may be spawned to use the first eight processors in order from the least utilized to the most utilized.

The apparatus 800 may also include a third logic 836 that is configured to selectively initiate a computer process to support reconstructing the item from fountain codes. The third logic 836 may spawn a process upon determining that the information about the computer resource indicates another computer process will produce a reduction in reconstruction time. In one embodiment, third logic 836 configures the computer processes based on the information about the resources. For example, the third logic 836 may configure a process with respect to where to access a fountain code. This may involve, for example, associating a data store with a process. Third logic 836 may configure a process with respect to where to process a fountain code. This may involve, for example, associating a processor with a process. The third logic 836 may configure a process with respect to where to provide a fountain code. This may involve, for example, associating a communication link and a target processor with a process.

Figure 9:
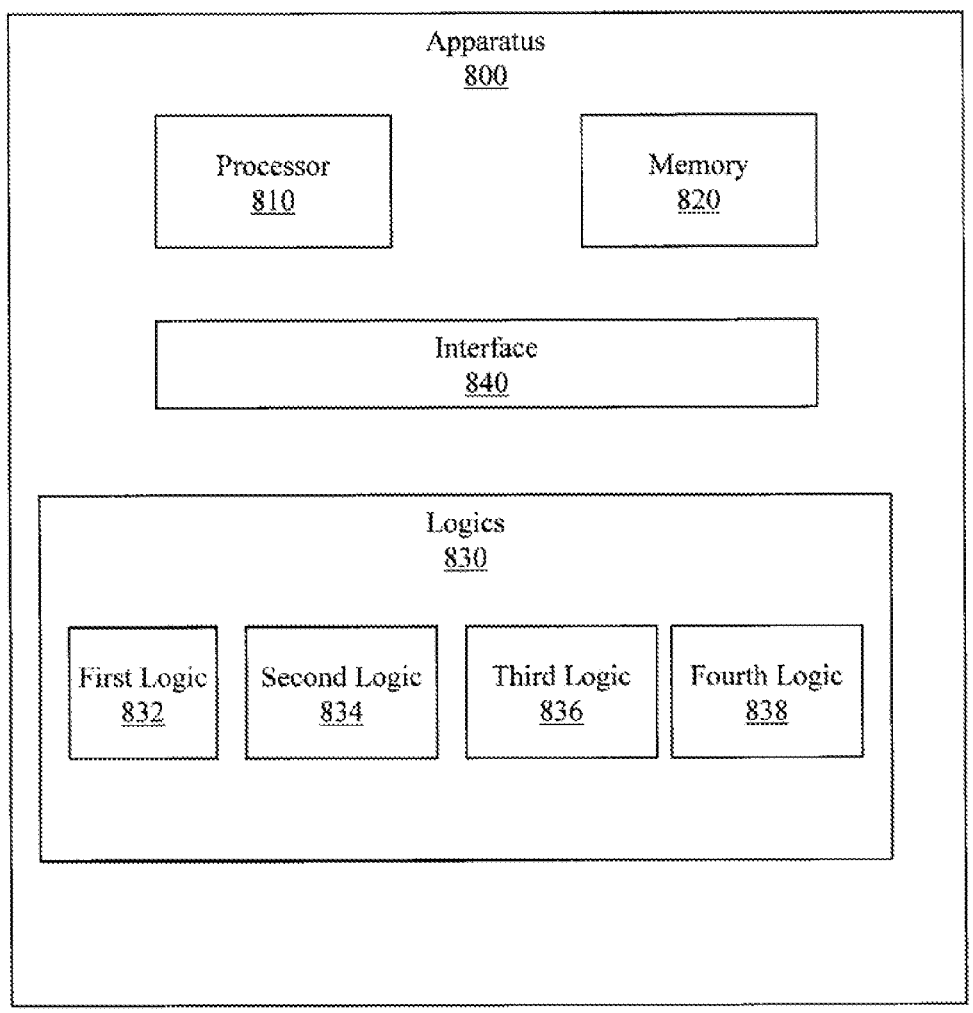
FIG. 9 illustrates an example apparatus configured to dynamically spawn and configure reconstruction processes used to support an erasure code based rebuild of an item for which erasure codes were stored.

FIG. 9 illustrates another embodiment of apparatus 800. This embodiment includes a fourth logic 838. The fourth logic 838 may be configured to terminate a computer process produced by the third logic 836. In one example, the fourth logic 838 may terminate a process upon determining that reconstructing the item has completed. In another example, the fourth logic 838 may terminate a process upon determining that the reconstruction of the item has completed beyond a threshold amount. For example, once reconstruction has progressed past a certain point, it may be desirable to allocate resources to other tasks. In one example, the third logic 838 may terminate a process upon determining that the process produced by the third logic 836 is not contributing at least a threshold amount to reconstructing the item. This decision may occur when, for example, the utilization of a resource changes or when the resource is no longer providing a service needed by the reconstruction. While the first logic 832, second logic 834, and third logic 836 may be tasked with producing as many rebuild agents (e.g., computer processes) as possible to support an erasure code reconstruction, the fourth logic 838 may be tasked with keeping alive the processes that are contributing the most to the erasure code reconstruction. Terminating a marginally productive process may free a resource or resources for use by another process that may contribute more to the reconstruction.

Figure 10:
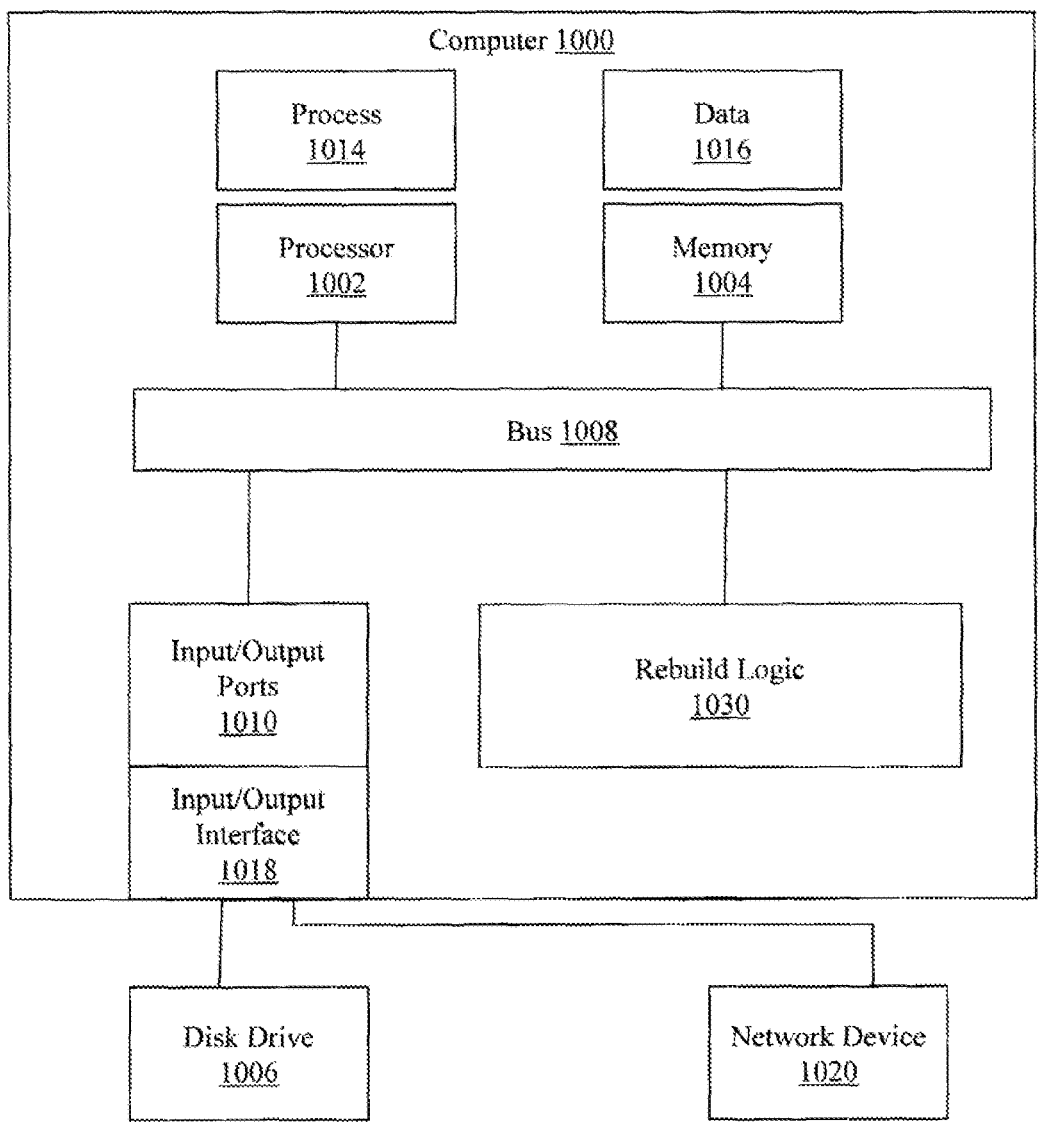
FIG. 10 illustrates an example apparatus associated with reconstructing an item from erasure codes (e.g., fountain codes).

FIG. 10 illustrates an example computing device in which example systems and methods described herein, and equivalents, may operate. The example computing device may be a computer 1000 that includes a processor 1002, a memory 1004, and input/output ports 1010 operably connected by a bus 1008. In one example, the computer 1000 may include a rebuild logic 1030 that is configured to dynamically control a rebuild process based on information about resources available to participate in the rebuild process. In different examples, the logic 1030 may be implemented in hardware, software, firmware, and/or combinations thereof. While the logic 1030 is illustrated as a hardware component attached to the bus 1008, it is to be appreciated that in one example, the logic 1030 could be implemented in the processor 1002.

Logic 1030 may provide means (e.g., hardware, software, firmware, circuit) for reconstructing an item from erasure codes. Reconstructing the item may include spawning a number of processes to collect erasure codes, to analyze erasure codes, to communicate erasure codes, or to take other actions. Conventional systems may perform a rebuild using pre-defined numbers of processes that act in pre-defined ways. Computer 1000 is not so limited. Instead, computer 1000 uses logic 1030 to acquire information about resources (e.g., computer components) and to dynamically control the rebuild process by dynamically controlling computer processes used to perform the rebuild. Thus, logic 1030 may also provide means (e.g., hardware, software, firmware, circuit) for accessing utilization and capacity data concerning computer components involved in accessing erasure codes. The computer components may be, for example, processors, disk drives or other storage, communication links, or other components. Logic 1030 may also provide means (e.g., hardware, software, firmware, circuit) for dynamically establishing a plurality of computer processes configured to operate at least partially in parallel to facilitate reconstructing the item from erasure codes. The number of computer processes is determined by the utilization and capacity data. For example, processes may not be spawned to use resources (e.g., components) whose utilization is already above a threshold but processes may be spawned for resources that have sufficient capacity to participate in the erasure code rebuild.

The means associated with logic 1030 may be implemented, for example, as an ASIC that implements the functionality of apparatus described herein. The means may also be implemented as computer executable instructions that implement the functionality of methods described herein and that are presented to computer 1000 as data 1016 that are temporarily stored in memory 1004 and then executed by processor 1002.

Generally describing an example configuration of the computer 1000, the processor 1002 may be a variety of various processors including dual microprocessor and other multiprocessor architectures. A memory 1004 may include volatile memory and/or non-volatile memory. Non-volatile memory may include, for example, ROM, PROM, and other memory. Volatile memory may include, for example, RAM, SRAM, DRAM, and other memory.

A disk 1006 may be operably connected to the computer 1000 via, for example, an input/output interface (e.g., card, device) 1018 and an input/output port 1010. The disk 1006 may be, for example, a magnetic disk drive, a solid state disk drive, a floppy disk drive, a tape drive, a Zip drive, a flash memory card, a memory stick, or other device. Furthermore, the disk 1006 may be a CD-ROM drive, a CD-R drive, a CD-RW drive, a DVD ROM drive, a Blu-Ray drive, an HD-DVD drive, or other device. The memory 1004 can store a process 1014 and/or a data 1016, for example. The disk 1006 and/or the memory 1004 can store an operating system that controls and allocates resources of the computer 1000.

The bus 1008 may be a single internal bus interconnect architecture and/or other bus or mesh architectures. While a single bus is illustrated, it is to be appreciated that the computer 1000 may communicate with various devices, logics, and peripherals using other busses (e.g., PCIE, 1394, USB, Ethernet). The bus 1008 can be types including, for example, a memory bus, a memory controller, a peripheral bus, an external bus, a crossbar switch, and/or a local bus.

The computer 1000 may interact with input/output devices via the i/o interfaces 1018 and the input/output ports 1010. Input/output devices may be, for example, a keyboard, a microphone, a pointing and selection device, cameras, video cards, displays, the disk 1006, the network devices 1020, and other devices. The input/output ports 1010 may include, for example, serial ports, parallel ports, and USB ports.

The computer 1000 can operate in a network environment and thus may be connected to the network devices 1020 via the i/o interfaces 1018, and/or the i/o ports 1010. Through the network devices 1020, the computer 1000 may interact with a network. Through the network, the computer 1000 may be logically connected to remote computers. Networks with which the computer 1000 may interact include, but are not limited to, a LAN, a WAN, and other networks.

While example systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A non-transitory computer-readable storage medium storing computer-executable instructions that when executed by a computer cause the computer to perform a method, the method comprising:
   upon detecting an erasure code rebuild of an item for which erasure codes are stored electronically:
   accessing electronic data about a set of resources that could participate in the erasure code rebuild; and
   selectively repetitively spawning a rebuild process as a function of the electronic data, where a rebuild process utilizes a member of the set of resources to support the erasure code rebuild of the item.

2. The non-transitory computer-readable storage medium of claim 1, where selectively repetitively spawning a rebuild process as a function of the electronic data comprises:
   spawning a rebuild process for any member of the set of resources that can contribute to the erasure code rebuild, where contributing to the erasure code rebuild includes acquiring an erasure code from storage, processing an erasure code, storing an erasure code, or communicating an erasure code.

3. The non-transitory computer-readable storage medium of claim 1, where selectively repetitively spawning a rebuild process as a function of the electronic data comprises:
   spawning a rebuild process for any member of the set of resources that can contribute to the erasure code rebuild and produce a utility that exceeds a rebuild relevance threshold, where contributing to the erasure code rebuild includes acquiring an erasure code from storage, processing an erasure code, storing an erasure code, or communicating an erasure code.

4. The non-transitory computer-readable storage medium of claim 1, comprising producing a ranking for the set of resources based, at least in part, on the data, and
   where selectively repetitively spawning a rebuild process as a function of the electronic data comprises:
   spawning rebuild processes in order for members of the set of resources that can contribute to the erasure code rebuild, where the order is determined by the ranking, and where contributing to the erasure code rebuild includes acquiring an erasure code from storage, processing an erasure code, storing an erasure code, or communicating an erasure code.

5. The non-transitory computer-readable storage medium of claim 1, where selectively repetitively spawning a rebuild process as a function of the electronic data comprises:
   identifying one or more other rebuild processes that are already participating in the erasure code rebuild;
   identifying members of the set of resources associated with the one or more other rebuild processes that are already participating in the erasure code rebuild, and
   spawning an additional rebuild process based, at least in part, on the one or more other rebuild processes and the members of the set of resources associated with the one or more other rebuild processes.

6. The non-transitory computer-readable storage medium of claim 1, where detecting the erasure code rebuild of an item comprises receiving a request to support an erasure code rebuild, receiving a request to perform an erasure code rebuild, or detecting a spawn of a rebuild process.

7. The non-transitory computer-readable storage medium of claim 1, where accessing electronic data about the set of resources includes receiving data pushed from a sensor agent associated with a resource or querying a sensor agent associated with a resource.

8. The non-transitory computer-readable storage medium of claim 7, where there is a one-to-one mutually exclusive relationship between a sensor agent and a corresponding resource.

9. The non-transitory computer-readable storage medium of claim 7, where there is a one-to-many non-mutually exclusive relationship between a sensor agent and two or more resources.

10. The non-transitory computer-readable storage medium of claim 7, where the resource is a processor resource, a storage resource, an input/output resource, or a communication resource.

11. The non-transitory computer-readable storage medium of claim 10, where the storage resource is a hard disk drive, a solid state device, or a tape drive.

12. The non-transitory computer-readable storage medium of claim 10, where the input/output resource is a hard disk drive input/output processor, a hard disk drive input/output process, a solid state device input/output processor, a solid state device input/output process, a tape drive input/output processor, or a tape drive input/output process.

13. The non-transitory computer-readable storage medium of claim 10, where the communication resource is a network interface or a network channel.

14. An apparatus, comprising:
a processor;
a memory;
a set of logics configured to support reconstructing an item from a set of fountain codes; and
an interface that connects the processor, the memory, and the set of logics;
the set of logics comprising:
a first logic configured to acquire information about one or more computer resources available to support reconstructing the item;
a second logic configured to analyze information about the one or more computer resources with respect to an effect that using the one or more computer resources would have on reconstructing the item; and
a third logic configured to selectively initiate a computer process to support reconstructing the item from fountain codes upon determining that the information about the computer resource indicates another computer process will produce a reduction in reconstruction time.

15. The apparatus of claim 14, where the first logic is configured to pull information about the one or more resources from one or more sensor agents or to receive information pushed by the one or more sensor agents to the first logic.

16. The apparatus of claim 15, where the second logic is configured to determine whether a member of the one or more computer resources will be used to support reconstructing the item.

17. The apparatus of claim 16, where the second logic is configured to determine the order in which members of the one or more computer resources will be used to support reconstructing the item.

18. The apparatus of claim 16, comprising a fourth logic configured to terminate a computer process produced by the third logic upon determining:
that reconstructing the item has completed,
that reconstructing the item has completed beyond a threshold amount, or
that the process produced by the third logic is not contributing at least a threshold amount to reconstructing the item.

19. The apparatus of claim 17, where the third logic configures the computer processes with respect to where to access a fountain code, where to process a fountain code, or where to provide a fountain code.

* * * * *